(12) United States Patent
Yumoto et al.

(10) Patent No.: US 11,302,602 B2
(45) Date of Patent: Apr. 12, 2022

(54) POWER-MODULE SUBSTRATE WITH HEAT-SINK

(71) Applicant: MITSUBISHI MATERIALS CORPORATION, Tokyo (JP)

(72) Inventors: Ryohei Yumoto, Saitama (JP); Sotaro Oi, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 263 days.

(21) Appl. No.: 16/491,707

(22) PCT Filed: Feb. 23, 2018

(86) PCT No.: PCT/JP2018/006745
§ 371 (c)(1),
(2) Date: Sep. 6, 2019

(87) PCT Pub. No.: WO2018/163864
PCT Pub. Date: Sep. 13, 2018

(65) Prior Publication Data
US 2021/0296204 A1  Sep. 23, 2021

(30) Foreign Application Priority Data
Mar. 7, 2017 (JP) .............................. JP2017-042544

(51) Int. Cl.
*H01L 23/373* (2006.01)
*H01L 21/48* (2006.01)

(52) U.S. Cl.
CPC ...... *H01L 23/3735* (2013.01); *H01L 21/4882* (2013.01); *H01L 23/3736* (2013.01)

(58) Field of Classification Search
CPC ............. H01L 23/3735; H01L 23/3736; H01L 21/4882
See application file for complete search history.

(56) References Cited

U.S. PATENT DOCUMENTS 6,033,787 A * 3/2000 Nagase ................... B32B 15/04
428/545
2015/0366048 A1* 12/2015 Nagase ............... H01L 23/4006
174/252

(Continued)

FOREIGN PATENT DOCUMENTS

CN 106463477 A 2/2017
EP 3057125 A1 8/2016

(Continued)

OTHER PUBLICATIONS

Supplementary European Search Report dated Nov. 27, 2020, issued for European Patent Application No. 18764170.9.

(Continued)

*Primary Examiner* — Patricia D Valenzuela
(74) *Attorney, Agent, or Firm* — Locke Lord LLP; James E. Armstrong, IV; Nicholas J. DiCeglie, Jr.

(57) ABSTRACT

A power-module substrate constructed by disposing a metal layer and a circuit layer comprising copper on a ceramic board; an aluminum layer; a copper layer; and a heat sink comprising an aluminum-impregnated silicon carbide porous body, wherein diffusion layers having an intermetallic compound of aluminum and copper are formed between the metal layer and the aluminum layer, between the aluminum layer and the copper layer, and between the copper layer and the aluminum-impregnated silicon carbide porous body, also wherein the circuit layer has a thickness $t1$ of 0.1-3.0 mm, the meta layer has a thickness $t2$ of 0.1-3.0 mm, a thickness $t3$ is not more than 3.0 mm, a thickness $t4$ is between 0.1 mm and 5.0 mm, and the ratio $[(\sigma 1 \times t1 \times A1)/\{(\sigma 2 \times t2 \times A2)+(\sigma 3 \times t3 \times A3)+(\sigma 4 \times t4 \times A4)\}]$ falls within the range of 0.06-0.70.

6 Claims, 5 Drawing Sheets

(56) References Cited

U.S. PATENT DOCUMENTS

| | | |
|---|---|---|
| 2016/0254209 A1 | 9/2016 | Oohiraki et al. |
| 2017/0053852 A1 | 2/2017 | Oi et al. |

FOREIGN PATENT DOCUMENTS

| | | | |
|---|---|---|---|
| EP | 3136433 A1 | 3/2017 | |
| EP | 3166140 A1 | 5/2017 | |
| JP | H10-270596 A | 10/1998 | |
| JP | 2003-306730 A | 10/2003 | |
| JP | 2007-299974 A | 11/2007 | |
| JP | 2008-147308 A | 6/2008 | |
| JP | 2009-88330 A | 4/2009 | |
| JP | 2014-39062 A | 2/2014 | |
| JP | 2014-143351 A | 8/2014 | |
| JP | 2015-130430 A | 7/2015 | |
| JP | 2015-216370 A | 12/2015 | |
| JP | 2016-046356 A | 4/2016 | |
| JP | 2016-051778 A | 4/2016 | |
| WO | WO-2015053316 A1 * | 4/2015 | ......... H01L 21/4882 |

OTHER PUBLICATIONS

International Search Report dated May 15, 2018, issued for PCT/JP2018/006745.

* cited by examiner

POWER-MODULE SUBSTRATE WITH HEAT-SINK

TECHNICAL FIELD

The present invention relates to a power-module substrate with heat-sink used for a semiconductor device controlling large current and large voltage.

Priority is claimed on Japanese Patent Application No. 2017-42544 filed Mar. 7, 2017, the content of which is incorporated herein by reference.

BACKGROUND ART

As a power-module substrate with heat-sink, following structure is known for example as described in Patent Document 1 or Patent Document 2: a circuit layer made of copper or the like is formed on one surface of a ceramic board to be an insulating layer, a metal layer made of copper or the like is formed on the other surface of the ceramic board, and a heat sink (a radiation board) made of aluminum, copper or the like is bonded on the other surface of the metal layer than the ceramic board. On a surface (an upper surface) of the circuit layer of the power-module substrate with heat-sink constructed as above, electronic parts such as semiconductor elements are soldered (mounted), so that a power module is manufactured.

The heat sink formed from aluminum or copper has a large difference in linear thermal expansion with respect to the power-module substrate. Therefore, the power-module substrate with heat-sink is bent by being heated in a mounting step of the electronic parts or being exposed in temperature variation in usage environment of the power module. For example, if the power-module substrate with heat-sink is bent while the mounting step of the electronic elements, the electronic elements may be displaced; or bonding reliability may be deteriorated because a warp and cracks may arise in solder-bonded parts.

If the power-module substrate with heat-sink is bent in the use environment of the power module, thermal conductive grease between the heat sink and a cooler is flown out because of a pump-out phenomenon, so that thermal resistance may be increased by deterioration of an adhesion property between the heat sink and the cooler. Moreover, if the power-module substrate with heat-sink is repeatedly bent as above, so that cracks may arise with a ceramic board.

Therefore, in an attempt to reduce the warp owing to the difference of linear thermal expansion between the power-module substrate and the heat sink, the heat sink is formed from an aluminum-impregnated silicon carbide porous body having low thermal expansion and high thermal conductivity instead of aluminum or copper, in this type of the power-module substrate with heat-sink.

The aluminum-impregnated silicon carbide porous body is, as described in Patent Document 3 or Patent Document 4, a complex body of aluminum and silicon carbide in which aluminum (Al) or an aluminum alloy is impregnated in a porous body principally formed from silicon carbide (SiC) and a coating layer formed form aluminum or an aluminum alloy is formed on a surface of the porous body.

CITATION LIST

Patent Document(s)

Patent Document 1: Japanese Unexamined Patent Application, First Publication No. H10-270596

Patent Document 2: Japanese Unexamined Patent Application, First Publication No. 2016-51778

Patent Document 3: Japanese Unexamined Patent Application, First Publication No. 2014-143351

Patent Document 4: Japanese Unexamined Patent Application, First Publication No. 2003-306730

SUMMARY OF INVENTION

Technical Problem

As described in Patent Document 3 or Patent Document 4, formerly, the heat sink was formed from the aluminum-impregnated silicon carbide porous body having the low thermal expansion and high thermal conductivity, so as to reduce the warps in the power-module substrate having heat sinks by reducing the difference in linear thermal expansion between the power-module substrate and the heat sink. However, it is not enough to reduce the warp in the power-module substrate with heat-sink, so that further improvement is required.

The present invention is achieved in consideration of the above circumstances, and has an object to provide a power-module substrate with heat-sink, with high reliability in power cycles and cooling/heating cycles.

Solution to Problem

A power-module substrate with heat-sink of the present invention including: a power-module substrate in which a circuit layer made of copper or a copper alloy is disposed on one surface of a ceramic board and a metal layer made of copper or a copper alloy disposed on another surface of the ceramic board; an aluminum layer made of aluminum and bonded on the metal layer; a copper layer made of copper or a copper alloy and bonded on the aluminum layer; and a heat sink bonded on the copper layer and formed from an aluminum-impregnated silicon carbide porous body in which aluminum or an aluminum alloy is impregnated to a porous body made of silicon carbide: in the power-module substrate with heat-sink of the present invention, between the metal layer and the aluminum layer, between the aluminum layer and the copper layer, and between the copper layer and the aluminum-impregnated silicon carbide porous body, diffusion layers having intermetallic compounds of aluminum and copper are formed; when yield stress of the circuit layer is σ1 (MPa), a thickness of the circuit layer is t1 (mm), a bonding area of the circuit layer to the ceramic board is A1 (mm$^2$); yield stress of the metal layer is σ2 (MPa), a thickness of the metal layer is t2 (mm), a bonding area of the metal layer to the ceramic board is A2 (mm$^2$); yield stress of the aluminum layer is σ3 (MPa), a thickness of the aluminum layer is t3 (mm), a bonding area of the aluminum layer on the metal layer is A3 (mm$^2$); yield stress of the copper layer is σ4 (MPa), a thickness of the copper layer is t4 (mm), and a bonding area of the copper layer to the aluminum layer is A4 (mm$^2$): in the power-module substrate with heat-sink of the present invention, the thickness t1 is formed to be 0.1 mm to 3.0 mm; the thickness t2 is formed to be 0.1 mm to 3.0 mm (inclusive); the thickness t3 is formed to be not more than 3.0 mm; and the thickness t4 is formed to be 0.1 mm to 5.0 mm (inclusive), and a ratio $[(\sigma1 \times t1 \times A1)/\{(\sigma2 \times t2 \times A2)+(\sigma3 \times t3 \times A3)+(\sigma4 \times t4 \times A4)\}]$ is in a range of 0.06 to 0.70 (inclusive).

The aluminum-impregnated silicon carbide porous body forming the heat sink has a coefficient of linear thermal expansion near to that of the ceramic board: however, there is a slightly difference in the coefficients of linear thermal expansion. Therefore, when the power-module substrate and the heat sink are bonded, a warp is generated resulting from the difference in the coefficients of linear thermal expansion at bonding surfaces between the ceramic board and the heat sink; so that the power-module substrate and the heat sink may be imperfectly bonded.

In the power-module substrate with heat-sink of the present invention, the aluminum layer and the copper layer are provided between the power-module substrate and the heat sink; and the metal layer made of copper or a copper alloy, the aluminum layer made of aluminum, the copper layer made of copper or a copper alloy, and the heat sink formed from the aluminum-impregnated silicon carbide porous body formed by impregnating aluminum or an aluminum alloy are layered in order, so as to be a structure in which copper and aluminum are alternatively layered. The layers which are mutually bonded are bonded by solid-phase diffusion bonding with the diffusion layers having intermetallic compounds consisting of metal atoms, i.e., copper and aluminum, in the members bonded on the surfaces. In the power-module substrate with heat-sink of the present invention, the power-module substrate and the heat sink are bonded by the solid-phase diffusion bonding with the aluminum layer and the copper layer therebetween, so that the members are mutually cohered and rigidly bonded. Moreover, the members are formed to have the thicknesses in the prescribed range and adjusted so as to have with the ratio $[(\sigma 1 \times t1 \times A1)/\{(\sigma 2 \times t2 \times A2)+(\sigma 3 \times t3 \times A3)+(\sigma 4 \times t4 \times A4)\}]$ being 0.06 to 0.70 (inclusive); so that the power-module substrate with heat-sink is formed without the warp resulting from bonding of the power-module substrate and the heat sink.

Moreover, the aluminum layer having a high effect of absorbing internal stress is disposed between the power-module substrate and the heat sink, so that the aluminum layer can absorb thermal stress resulting from the difference in thermal expansion between the power-module substrate and the heat sink, and it is possible to reduce the load by the hot-cold cycles applied on the power-module substrate. Moreover, by disposing the rigid copper layer having a larger coefficient of linear thermal expansion than that of the aluminum-impregnated silicon carbide porous body or ceramics, it is possible to reduce the warp owing to the difference in linear thermal expansion between the ceramic board and the heat sink. Accordingly, it is possible to reduce the warp resulting from the thermal expansion when the power-module substrate with heat-sink is heated, for instance, for bonding the semiconductor elements, so that the breakage (the cracks) of the ceramic board can be prevented. Therefore, it is possible to form the power-module substrate with heat-sink with high reliability against the power cycles and hot-cold cycles.

Furthermore, the respective thicknesses t1 to t4 of the circuit layer, the metal layer, the aluminum layer, and the copper layer are the thicknesses excluding the diffusion layers. If the thickness t1 of the circuit layer and the thickness t2 of the metal layer are less than 0.1 mm, bonding material used for bonding of the ceramic board to the circuit layer and the ceramic board to the metal layer may be spread out on the surface of the circuit layer when it is heated: if the thickness t1 and the thickness t2 are more than 3.0 mm, when the power-module substrate with heat-sink is heated, for instance, when the semiconductor elements are bonded, the ceramic board may be cracked.

If the thickness t3 of the aluminum layer is more than 3.0 mm, by enlarging (thickening) the thickness t3, the warp of the power-module substrate with heat-sink is increased. Moreover, the thermal resistance is increased by enlarging the thickness t3, so that the cooling performance is deteriorated.

If the thickness t4 of the copper layer is less than 0.1 mm, it is not sufficiently effective by providing the copper layer to reduce the warp in the power-module substrate with heat-sink. If the thickness t4 is more than 5.0 mm, because large internal stress is applied on the ceramic board from the copper layer having high rigidity and the high coefficient of linear thermal expansion, for instance of bonding the semiconductor elements or the like, when the power-module substrate with heat-sink is heated, the ceramic board may crack.

As a preferred embodiment of the power-module substrate with heat-sink of the present invention, on a lower surface of the heat sink, when a center position of a bonding surface of the heat sink to the copper layer is a center of a measuring area, a maximum length in the measuring area is L (mm) and a deformation amount of the heat sink in the measuring area is Z (mm); and when a value of a warp $(Z/L^2)$ is X when it is heated to 285° C. and a value of a warp $(Z/L^2)$ is Y when it is cooled to 30° C. after heated to 285° C., a difference (Y–X) between the warp X and the warp Y is $-18.0 \times 10^{-6}$ (mm$^{-1}$) to $18.0 \times 10^{-6}$ (mm$^{-1}$) (inclusive). Here, the deformation amount Z is positive for the deformation of projecting toward the circuit layer side; or it is negative for the deformation of projecting toward the lower surface side of the heat sink.

In the power-module substrate with heat-sink in which the difference (Y–X) between the warp X when it is heated to 285° C. and the warp Y when it is cooled to 30° C. from 285° C. after heating is $-18.0 \times 10^{-6}$ (mm$^{-1}$) to $18.0 \times 10^{-6}$ (mm$^{-1}$) (inclusive), the difference between the warps at low temperature (30° C.) and at high temperature (285° C.) is also small. In this power-module substrate with heat-sink described above, the warp in soldering or wire-bonding of the electronic parts on the circuit layer and the warp in applying the hot-cold cycles on a power module are small, so that workability can be improved in a manufacturing process of soldering or the like of the electronic parts; and the ceramic board can be prevented from cracking by heating.

As a preferred embodiment in the power-module substrate with heat-sink of the present invention, a ratio (t1/t2) of the thickness t1 of the circuit layer to the thickness t2 of the metal layer is preferably not less than 0.75 and less than 1.25.

The thickness t1 of the circuit layer and the thickness t2 of the metal layer are substantially the same, so that the power-module substrate scarcely warps: accordingly, bondability of the layers can be improved because it is possible to prevent forming a clearance between the layers when bonding the power-module substrate and the heat sink with interposing an aluminum board (the aluminum layer) and a copper board (the copper layer) between the power-module substrate and the heat sink.

As a preferred embodiment in the power-module substrate with heat-sink, it is preferable that the warp X be $-50 \times 10^{-6}$ (mm$^{-1}$) to $50 \times 10^{-6}$ (mm$^{-1}$) (inclusive), and the warp Y be $-50 \times 10^{-6}$ (mm$^{-1}$) to $50 \times 10^{-6}$ (mm$^{-1}$) (inclusive).

If the warp X and the warp Y is more than $50 \times 10^{-6}$ (mm$^{-1}$), a large amount of grease used between the heat sink and a water-cooled cooler is necessary when fastening the power-module substrate with heat-sink to the water-cooled cooler; so that the thermal resistance may be increased. Moreover, the warps X and Y are less than $-50 \times 10^{-6}$ ($mm^{-1}$), the cracks or the like may be generated since the load is applied on the ceramic board when the power-module substrate with heat-sink is fastened to the water-cooled cooler or the like.

As a preferred embodiment of the power-module substrate with heat-sink of the present invention, the thickness t3 of the aluminum layer is preferably not less than 0.01 mm.

If the thickness t3 of the aluminum layer is less than 0.01 mm, the bondability of the metal layer to the aluminum layer and the aluminum layer to the copper layer may be deteriorated.

Advantageous Effects of Invention

According to the power-module substrate with heat-sink of the present invention, the cracks can be restrained in the ceramic board resulting from the variation of temperature, so that it is possible to improve the reliability against the power cycles and the hot-cold cycles.

DESCRIPTION OF EMBODIMENTS

Figure 1:
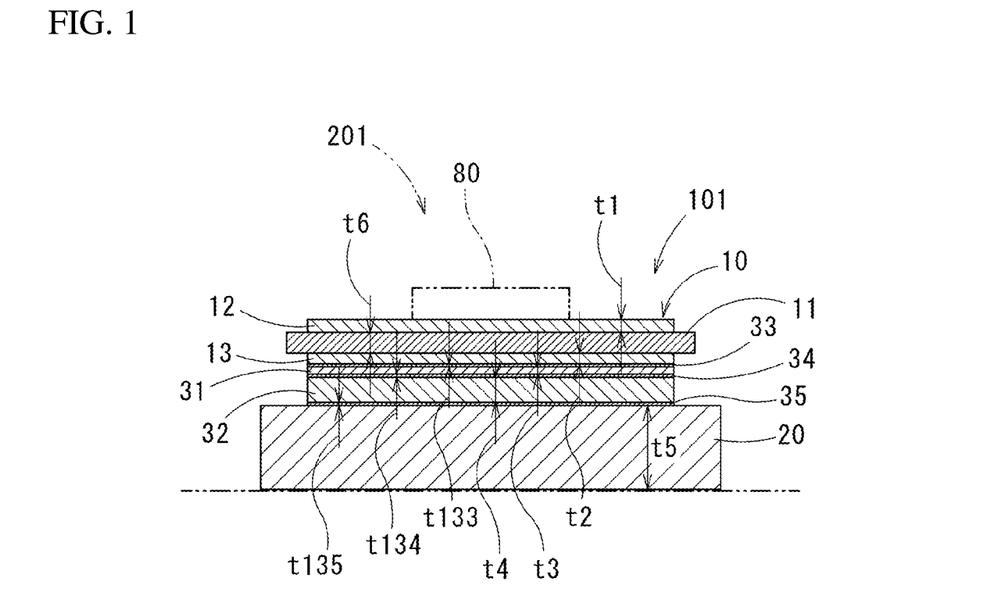
FIG. 1 It is a sectional view showing a power-module substrate with heat-sink of the present invention.

Below, embodiment(s) of the present invention will be explained with referring to drawings. A power-module substrate with heat-sink 101 of the present embodiment is shown in FIG. 1. The power-module substrate with heat-sink 101 is provided with a power-module substrate 10, an aluminum layer 31 bonded on the power-module substrate 10, a copper layer 32 bonded on the aluminum layer 31, and a heat sink 20 bonded on the copper layer 32. In the power-module substrate with heat-sink 101, diffusion layers 33, 34, and 35 are formed respectively between the metal layer 13 of the power-module substrate 10 and the aluminum layer 31, between the aluminum layer 31 and the copper layer 32, and the copper layer 32 and the heat sink 20: the layers from the metal layer 13 to the heat sink 20 are respectively bonded by the diffusion layers 33, 34, and 35.

A ceramic board 11 prevents electrical connection between a circuit layer 12 and a metal layer 13. The ceramic board 11 is formed from ceramic with a high insulation property, such as AlN (aluminum nitride), $Si_3N_4$ (silicon nitride), $Al_2O_3$ (alumina), SiC (silicon carbide) or the like; a thickness t6 is formed in a range of not less than 0.32 mm and not more than 1.0 mm.

The circuit layer 12 is formed by bonding of a copper board made of copper or a copper alloy (preferably oxygen-free copper: OFC) on one surface of the ceramic board 11. The circuit layer 12 is formed to have a thickness t1 (a thickness of the copper board) in a range not less than 0.1 mm and not more than 3.0 mm. The circuit layer 12 is formed in a prescribed circuit pattern by etching or the like.

The metal layer 13 is formed by bonding of a copper board made of copper or copper alloy (preferably oxygen-free copper: OFC) on the other surface of the ceramic board 11. The metal layer 13 is formed to have a thickness t2 (a thickness of the copper board) in a range of not less than 0.1 mm and not more than 3.0 mm.

The power-module substrate 10 has a structure in which the circuit layer 12 and the metal layer 13 are arranged on surfaces of the ceramic board 11. In the power-module substrate 10, as shown in FIG. 1, when the thickness of the circuit layer 12 is t1 (mm) and the thickness of the metal layer 13 is t2 (mm), it is preferable that a relation between the circuit layer 12 and the metal layer 13 be controlled in a range in which a ratio (t1/t2) is not less than 0.75 and less than 1.25. In this case, the thickness t1 of the circuit layer 12 and the thickness t2 of the metal layer 13 are substantially the same, so that the circuit layer 12 and the metal layer 13 having the same thickness are bonded on both the surfaces of the ceramic board 11: as a result, the power-module substrate 10 scarcely warps. Accordingly, when the power-module substrate 10 and the heat sink 20 are bonded with interposing an aluminum board (the aluminum layer 31) and a copper board (the copper layer 32) mentioned later therebetween respectively, when interposing the aluminum board and the copper board between the power-module substrate 10 and the heat sink 20, it is possible to prevent to make a clearance between the layers, and bondability between the layers can be improved.

Figure 2:
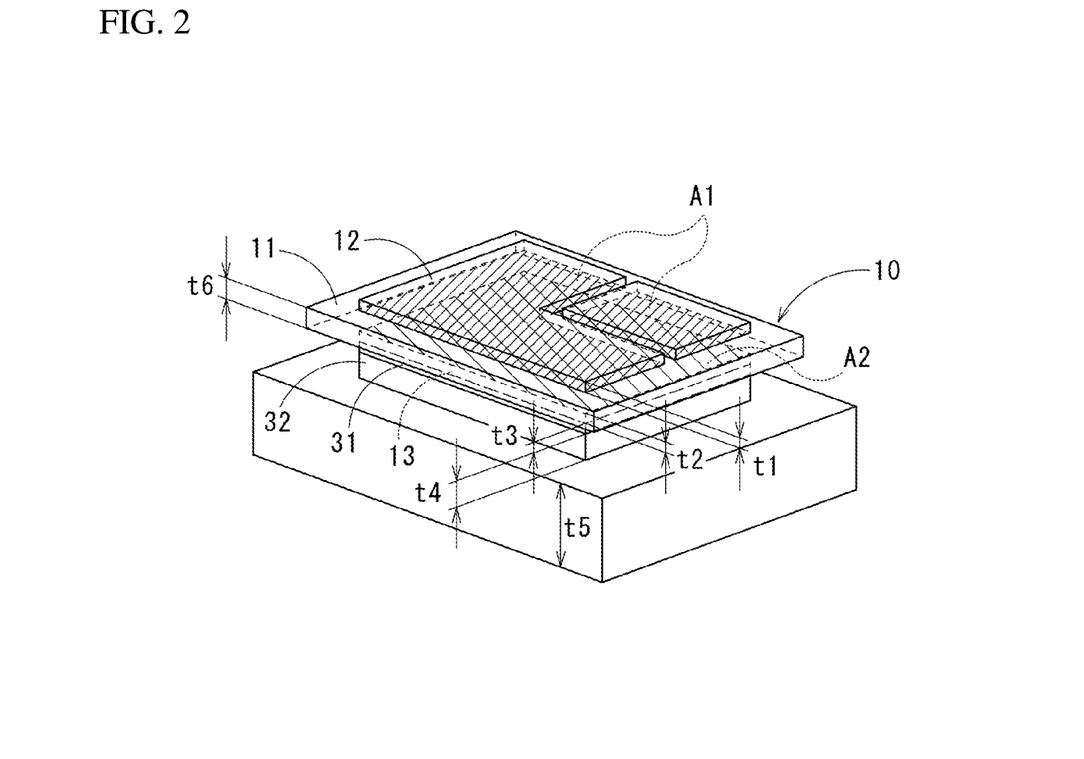
FIG. 2 It is a perspective view of the power-module substrate with heat-sink shown in FIG. 1.

A circuit pattern is formed in the circuit layer 12; as shown in FIG. 2, if it has pattern forms which are divided into a plurality of parts, a bonding area A1 ($mm^2$) of the respective pattern forms to the ceramic board 11 is, normally, set to about 90% of a bonding area A2 ($mm^2$) of the metal layer 13 to the ceramic board 11.

The aluminum layer 31 is, as shown in FIG. 1, formed by solid-phase diffusion bonding of an aluminum board or an aluminum alloy board on a lower surface of the metal layer 13. The metal layer 13 and the aluminum layer 31 are, by mutually diffusing copper atoms in the metal layer 13 and aluminum atoms in the aluminum layer 31, bonded by forming the diffusion layer 33 containing an intermetallic compound consisting of copper and aluminum. The aluminum layer 31 is bonded on the whole of the lower surface of the metal layer 13; a bonding area A3 ($mm^2$) of the aluminum layer 31 and the metal layer 13 is set to be a same size as the bonding area A2 ($mm^2$) between the metal layer 13 and the ceramic board 11. The aluminum layer 31 is formed to have a thickness t3 (mm) in a range of not less than 0.1 mm and not more than 3.0 mm. The diffusion layer 33 is formed to have a thickness t133 in a range of not less than 2 μm and not more than 50 μm.

For the aluminum board or the aluminum alloy board used for the aluminum layer 31, an aluminum board (2N—Al) with purity not less than 99.9% by mass, an aluminum board (4N—Al) with purity not less than 99.99% by mass, a board of A3003, a board of A6063 or the like can be used. The thickness t3 of the aluminum layer 31 is a thickness excluding the thickness t133 and a thickness t134 of the diffusion layers 33 and 34; the thicknesses t133 and t134 of the diffusion layer 33 and 34 are not included.

The copper layer 32 is formed by solid-phase diffusion bonding of a copper board made of copper or a copper alloy on the lower surface of the aluminum layer 31. The aluminum layer 31 and the copper layer 32 are, by mutually diffusion of aluminum atoms in the aluminum layer 31 and copper atoms in the copper layer 32, bonded by forming the diffusion layer 34 containing an intermetallic compound consisting of copper and aluminum. The copper layer 32 is bonded on the whole of the lower surface of the aluminum layer 31: a bonding area A4 ($mm^2$) of the copper layer 32 and the aluminum layer 31 is set to be a same size as the bonding area A2 ($mm^2$) of the metal layer 13 and the ceramic board 11. The copper layer 32 is formed to have a thickness t4 (mm) in a range of not less than 0.1 mm and not more than 5.0 mm. The diffusion layer 34 is formed to have the thickness t134 in a range of not less than 2 μm and not more than 50 μm. The thickness t4 of the copper layer 32 is a thickness excluding the thickness t134 and a thickness t135 of the diffusion layers 34 and 35; the thicknesses t134 and t135 of the diffusion layer 34 and 35 are not included.

As shown in FIG. 1, when yield strength of the circuit layer 12 is σ1 (MPa), the thickness of the circuit layer 12 is t1 (mm), the bonding area of the circuit layer 12 and the ceramic board 11 is A1 ($mm^2$), when yield strength of the metal layer 13 is σ2 (MPa), the thickness of the metal layer 13 is t2 (mm), the bonding area of the metal layer 13 and the ceramic board 11 is A2 ($mm^2$), when yield strength of the aluminum layer 31 is σ3 (MPa), the thickness of the aluminum layer 31 is t3 (mm), the bonding area of the metal layer 13 and the aluminum layer 31 is A3 ($mm^2$), and when yield strength of the copper layer 32 is σ4 (MPa), the thickness of the copper layer 32 is t4 (mm), the bonding area of the aluminum layer 31 and the copper layer 32 is A4 ($mm^2$), a correlation among the circuit layer 12, the metal layer 13, the aluminum layer 31, and the copper layer 32 is controlled so that a ratio $[(σ1×t1×A1)/\{(σ2×t2×A2)+(σ3×t3×A3)+(σ4×t4×A4)\}]$ is in a range not less than 0.06 and not more than 0.70. The yield strengths σ1 to σ4 at this time are the yield strengths at 25° C. in which a temper designation is "O".

Figure 3:
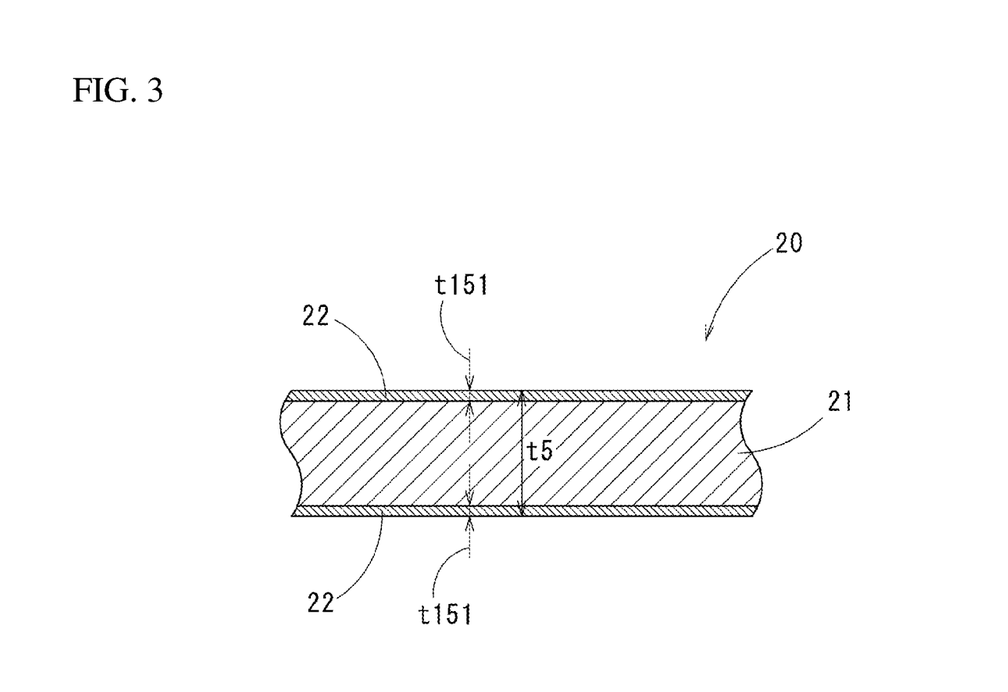
FIG. 3 It is a sectional view of an essential part of a heat sink.

The heat sink 20 is for cooling the power-module substrate 10. The heat sink 20 is, as shown in FIG. 1, bonded on a lower surface of the copper layer 32 by the sold diffusion bonding. The heat sink 20 cools heat conducted from the power-module substrate 10 via the aluminum layer 31 and the copper layer 32. The heat sink 20 is, as shown in FIG. 3, formed from an aluminum-impregnated silicon carbide porous body in which aluminum (Al) or an aluminum alloy is impregnated in a porous body 21 made of silicon carbide (SiC) and coating layers 22 of aluminum or the aluminum alloy impregnated inside are formed on surfaces of the porous body 21, and formed into a flat plane shape.

For aluminum impregnated in the porous body 21 of the heat sink 20, pure aluminum such as aluminum (2N—Al) with purity not less than 99% by mass or aluminum (4N—Al) with purity not less than 99.99% by mass, or an aluminum alloy having composition of Al: 80% to 99% by mass (inclusive), Si: 0.01% to 13.5% by mass (inclusive), Mg: 0.03% to 5.0% by mass (inclusive), and a remainder: impurities can be used. Aluminum alloys such as ADC12 or A356 can be also used.

A thickness t5 of the heat sink 20 can be not less than 0.5 mm and not more than 5.0 mm. The thickness t5 of the heat sink 20 is, as shown in FIG. 3, a thickness includes a thickness t151 of the coating layers 22 coating both the surfaces of the porous body 21. The thickness t151 of the coating layer 22 in one surface is preferably 0.01-folds to 0.1-folds (inclusive) of the thickness t5 of the heat sink 20. Between the copper layer 32 and the heat sink 20, by mutually diffusing copper atoms in the copper layer 32 and aluminum atoms in the heat sink 20, the diffusion layer 35 having intermetallic compound consisting of copper and aluminum is formed. The thickness t135 of the diffusion layer 35 is preferably formed in a range of the thickness t151 of the coating layers 22, not less than 2 μm and not more than 50 μm.

The heat sink 20 in which the coating layers 22 are formed on the surfaces of the porous body 21 is manufactured by, for example, arranging the porous body 21 in a mold provided to have a prescribed clearance around thereof, press-inserting heated and melted aluminum or an aluminum alloy in the mold, and cooling it in a pressured state. As described above, by press-inserting aluminum or the like, the aluminum alloy can be impregnated inside the porous body 21 in which wettability to aluminum and the like is low; and furthermore, aluminum or the like is filled in the clearance around the porous body 21, so that the coating layers 22 having the prescribed thickness can be formed on the surface of the porous body 21. In addition, by performing a cutting of the formed coating layers 22, the thickness t151 of the coating layers 22 may be adjusted.

As an example of a desirable combination of the power-module substrate with heat-sink 101 of the present embodiment, members in the power-module substrate 10 are structured as that, for example, the ceramic board 11 is an AlN (aluminum nitride) with the thickness t6=0.635 mm, the circuit layer 12 is an OFC (oxygen-free copper, the yield strength σ1: 200 MPa) with the thickness t1=0.3 mm, and the metal layer 13 is an OFC (oxygen-free copper, the yield strength σ2: 200 MPa) with the thickness t2=0.3 mm. Moreover, structured are the aluminum layer 31 by a 4N—Al (so-called 4N aluminum, the yield strength σ3: 28 MPa) with the thickness t3=0.25 mm, and the copper layer 32 by an OFC (oxygen-free copper, the yield strength σ4: 200 MPa) with the thickness t4=2.0 mm. When the respective bonding areas A1 to A4 are 1369 $mm^2$, the ratio $[(σ1×t1×A1)/\{(σ2×t2×A2)+(σ3×t3×A3)+(σ4×t4×A4)\}]$ =0.13. In the heat sink 20, the aluminum or the like which is impregnated is structured from an Al—Si-based alloy; the whole thickness t5 is 5.0 mm; the thickness t151 of the coating layers 22 is structured as about 100 μm; and the respective thicknesses t133 to t135 of the diffusion layers 33, 34, and 35 are about 25 μm.

Coefficients of linear thermal expansion of the respective members are, $4.5×10^{-6}$ $K^{-1}$ for the ceramic board 11 made of AlN; $17.7×10^{-6}$ $K^{-1}$ for the circuit layer 12, the metal layer 13, and the copper layer 32 made of OFC; $23.6×10^{-6}$ $K^{-1}$ for the aluminum layer 31 made of 4N—Al; and $8.5×10^{-6}$ $K^{-1}$ for the heat sink 20 made of the aluminum-impregnated silicon carbide porous body in which the Al—Si-based alloy is impregnated.

Electronic parts 80 such as a semiconductor element and the like are mounted on an upper surface of the circuit layer 12 of the power-module substrate with heat-sink 101 structured as above, as shown in FIG. 1, the power module 201 is manufactured. The electronic parts 80 are soldered on the upper surface of the circuit layer 12 with a solder material such as Sn—Cu, Sn—Cu—Ni or the like; although an illustration is omitted, solder-bonding parts with a thickness about 50 μm to 200 μm are formed between the electronic parts 80 and the circuit layer 12.

Below, a manufacturing process of the power-module substrate with heat-sink 101 of the present embodiment will be explained.

First, bonded are the copper board to be the circuit layer 12 and the ceramic board 11; and the copper board to be the metal layer 13 and the ceramic board 11. The bonding of the copper board to be the circuit layer 12 and the copper board to be the metal layer 13 to the ceramic board 11 is performed by a so-called active-metal brazing method.

Figure 4:
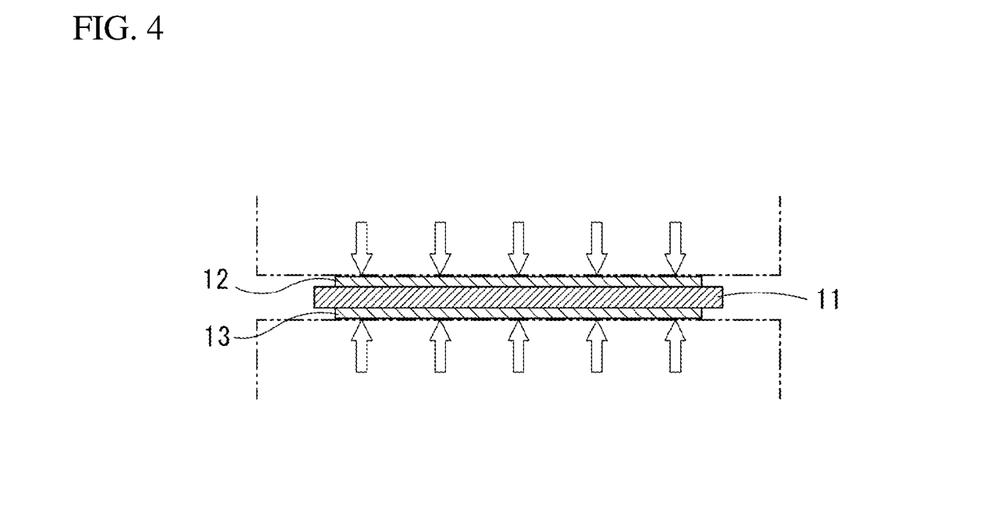
FIG. 4 It is a view explaining a part of a manufacturing method of the power-module substrate with heat-sink shown in FIG. 1, and is a sectional view explaining a manufacturing method of a power-module substrate.

For details, on an upper surface of the ceramic board 11, the copper board to be the circuit layer 12 is layered with interposing an active-metal brazing material (not illustrated) such as Ag—Cu—Ti, Ag—Ti or the like; and also on a lower surface of the ceramic board 11, the copper board to be the metal layer 13 is layered with interposing the same active-metal brazing material. Then a layered body in which these copper boards, the active-metal brazing materials, and the ceramic board 11 are layered is, as shown in FIG. 4, heated in a state of being pressurized in a layered direction thereof in a range not less than 0.1 MPa and not more than 3.5 MPa; so that the copper board to be the circuit layer 12 and the ceramic board 11, the copper board to be the metal layer 13 and the ceramic board 11 are respectively bonded; and the power-module substrate 10 is manufactured. A heating condition of this time is 850° C. for heating temperature and 10 minutes for heating time, for example.

Figure 5:
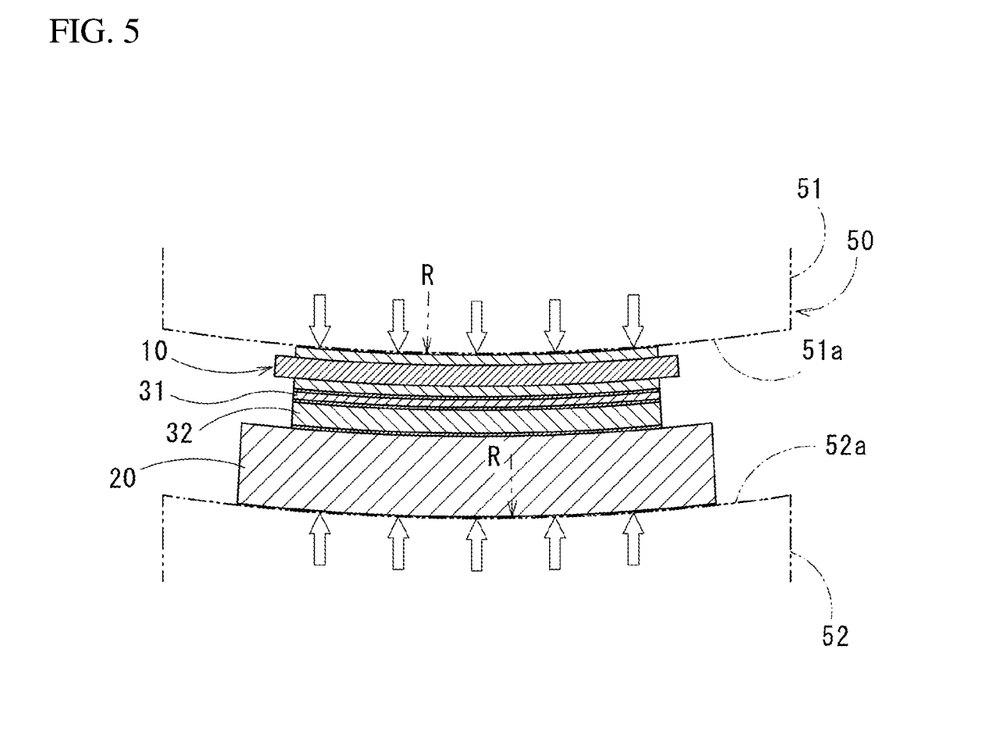
FIG. 5 It is a view explaining a part of the manufacturing method of the power-module substrate with heat-sink shown in FIG. 1, and is a sectional view explaining a bonding step of the power-module substrate and the heat sink.

Next, on the lower surface of the metal layer 13 of the power-module substrate 10, the heat sink 20 is bonded with interposing the aluminum layer 31 and the copper layer 32. For the bonding of the power-module substrate 10 and the heat sink 20, as shown in FIG. 5, it is preferable to use a pressurizing tool 50 having a pressure board 51 having a pressurizing surface 51a with a protruded-curved surface shape and a pressurizing board 52 having a pressurizing surface 52a with a depressed-curved surface shape. In the two pressurizing boards 51 and 52, it is preferable to form the pressurizing surfaces 51a and 52a which face each other to be a depressed surface or a protruded surface having a curved surface in which a radius of curvature R is 3000 mm to 7000 mm. In this case, as shown in FIG. 5, the pressurizing surface 52a of the pressurizing board 52 pressurizing a lower surface of the heat sink 20 in a lamination direction is formed as the depressed surface; and the pressurizing surface 51a of the pressurizing board 51 pressurizing an upper surface of the power-module substrate 10 (the upper surface of the circuit layer 12) in the lamination direction is formed as the protruded surface. In addition, although illustrations are omitted, the pressurizing tool 50 is provided with an energizing device such as spring or the like to give a pressurizing force by energizing the pressurizing boards 51 and 52 in the lamination direction. In addition, flat boards can be used as the pressurizing boards 51 and 52.

Between the pressurizing board 51 and the pressurizing board 52 of the pressurizing tool 50 structured as above, the power-module substrate 10, an aluminum board to be the aluminum layer 31, a copper board to be the copper layer 32, and the heat sink 20 are disposed with layering in an order so as to make a state in which these are interposed in the lamination direction. In this time, the layered body in which these are layered is pressurized by the pressurizing surface 51a of the pressurizing board 51 and the pressurizing surface 52a of the pressurizing board 52, and maintained in a state in which a deformation (a warp) in which the lower surface of the heat sink 20 is downwardly protruded is produced. By heating this layered body in the pressurized state by the pressurizing tool 50, the lower surface of the metal layer 13 in the power-module substrate 10 and an upper surface of the aluminum layer 31, the lower surface of the aluminum layer 31 and an upper surface of the copper layer 32, and the lower surface of the copper layer 32 and an upper surface of the heat sink 20 are respectively bonded by solid-phase diffusion bonding.

In this case, the solid-phase diffusion bonding is performed by maintaining in vacuum atmosphere, at a pressurizing load (a pressurizing forth) 0.1 MPa to 3.5 MPa, heating temperature 450° C. to 548° C. (inclusive), for 5 minutes to 240 minutes. As a result, with respect to the metal layer 13 and the aluminum layer 31, the aluminum layer 31 and the copper layer 32, and the copper layer 32 and the heat sink 20, the diffusion layers 33, 34, and 35 having the intermetallic compound of copper and aluminum are formed between the layers by mutually diffusion of copper atoms and aluminum atoms; and those are bonded with the diffusion layers 33, 34, and 35 with interposing therebetween.

The thicknesses of the respective diffusion layers 33, 34, and 35 are increased in accordance with a bonding time; the diffusion layers 33, 34, and 35 are formed to have substantially the same thickness. The thicknesses of the respective diffusion layers 33, 34, and 35 are formed in a range not less than 2 μm and not more than 50 μm.

Figure 6:
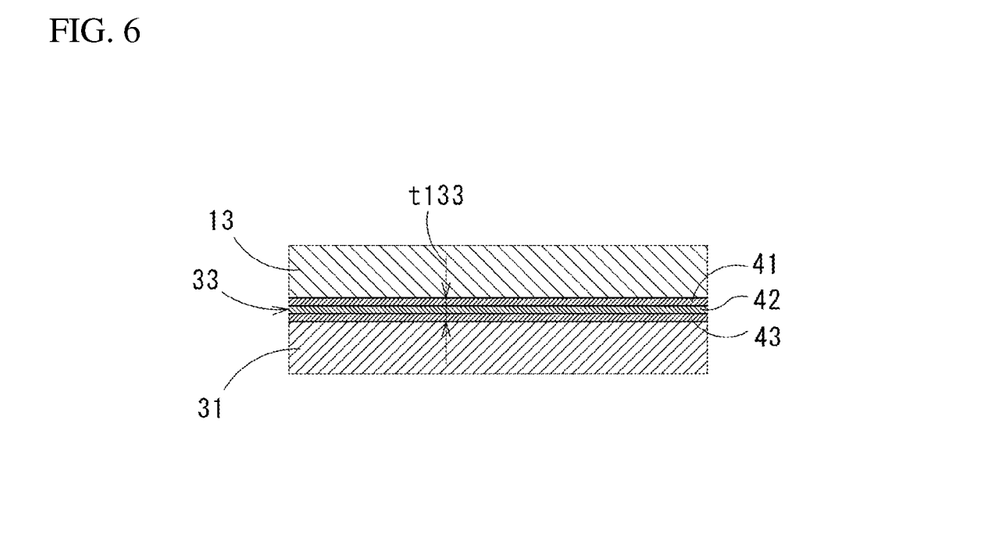
FIG. 6 It is a sectional view of an essential part of a bonding boundary of a metal layer and an aluminum layer.

Here, the solid-phase diffusion bonding between aluminum (the aluminum layer 31 and the heat sink 20) and copper (the metal layer 13 and the copper layer 32) will be explained with an example to bond the aluminum layer 31 and the metal layer 13 with referring to FIG. 6.

The aluminum layer 31 and the metal layer 13 are bonded by forming the diffusion layer 33 having the intermetallic compound of aluminum and copper by mutually diffusion of aluminum atoms in the aluminum layer 31 and copper atoms in the metal layer 13. The diffusion layer 33 has, as shown in FIG. 6, a structure in which intermetallic compound phases 41, 42 and 43 having different compositions respectively are layered along boundary surfaces in accordance with a ratio of existences of aluminum atoms and copper atoms. That is to say, in an area of the aluminum layer 31 side in the diffusion layer 33, an intermetallic compound phase in which the ratio of existence of aluminum atoms is high and a content amount of aluminum is large is formed. On the other hand, in an area of the metal layer 13 side in the diffusion layer 33, an intermetallic compound phase in which the ratio of existence of copper atoms is high and a content amount of copper is large is formed. In the example shown in FIG. 6, the diffusion layer 33 has a structure in which three intermetallic compound phases, i.e., a θ phase 43, an η phase 42, and a ζ phase 41 are layered in an order from the aluminum layer 31 side toward the metal layer 13 side.

In addition, the diffusion layer 33 may have a structure in which a θ phase and an η2 phase are layered along a bonding boundary surface in an order from the aluminum layer 31 side toward the metal layer 13 side; moreover, at least one phase among a ζ2 phase, a δ phase and a γ2 phase is further layered. It is the same in the diffusion layers 34 and 35.

Next, a bonded body of the power-module substrate 10 and the heat sink 20 bonded as above is cooled to 30° C. in a state installed to the pressurizing tool 50, i.e., in a pressurized state. In this case, the bonded body of the power-module substrate 10 and the heat sink 20 is pressurized in the thickness direction by the pressurizing tool 50, and held in a state in which a deformation is produced so that the lower surface of the heat sink 20 warps with projecting downward. Accordingly, a shape of the bonded body appears to remain unchanged by cooling; however, since it is pressurized against internal stress and held in a state in which it cannot be deformed as a warp by cooling, a plastic deformation is generated. After cooling to 30° C., the pressure by the pressurizing tool 50 is released, so that the power-module substrate with heat-sink 101 is manufactured.

In the power-module substrate with heat-sink 101, the aluminum layer 31 and the copper layer 32 are layered between the heat sink 20 and the power-module substrate 10 formed flat as above and the members are bonded by the solid-phase diffusion bonding, so it is possible to rigidly bond the members with being closely in contact with each other: moreover, the members are formed in a range of prescribed thickness, and the members are controlled in a range of a ratio $[(\sigma 1 \times t1 \times A1)/\{(\sigma 2 \times t2 \times A2)+(\sigma 3 \times t3 \times A3)+(\sigma 4 \times t4 \times A4)\}]$ being not less than 0.06 and not more than 0.07: the power-module substrate with heat-sink 101 is formed without warping in the bonding. In the power-module substrate with heat-sink 101, between the metal layer 13 and the aluminum layer 31, between the aluminum layer 31 and the copper layer 32, and between the copper layer 32 and the heat sink 20 (the aluminum-impregnated silicon carbide porous body), i.e., between mutually bonded layers, are bonded with interposing the diffusion layers 33, 34 and 35 having the intermetallic compound consisting of copper and aluminum which are metal atoms in the members bonded on the surfaces.

In the power-module substrate with heat-sink 101, by disposing the aluminum layer 31 having a high effect of buffering the internal stress between the power-module substrate 10 and the heat sink 20, thermal stress owing to a difference in thermal expansion between the power-module substrate 10 and the heat sink 20 can be absorbed in the aluminum layer 31, it is possible to buffer a load by hot-cold cycles on the power-module substrate 10. Moreover, by disposing the copper layer 32 having high rigidity and a larger coefficient of linear thermal expansion than that of the aluminum-impregnated silicon carbide porous body and ceramics, it is possible to reduce warps caused from the difference in linear thermal expansion between the ceramic board 11 and the heat sink 20. For example in bonding the semiconductor elements and the like, the warps resulting from the thermal expansion by heating the power-module substrate with heat-sink 101 can be reduced, so it is possible to prevent breakages (cracks) of the ceramic board 11. Accordingly, it is possible to form the power-module substrate with heat-sink 101 having high reliability against the power cycles and the hot-cold cycles.

In the power-module substrate with heat-sink 101, on the lower surface (a back surface) of the heat sink 20, as shown in FIG. 7 and FIG. 8A to FIG. 8C, a center position C of a bonding surface of the heat sink 20 and the copper layer 32 is set as a center of a measuring area E, a maximum length in the measuring area E is set as L, and a deformation amount of the heat sink 20 in the measuring area E is set as Z: a value of a warp $(Z/L^2)$ when heated to 285° C. is set as X, and a value of a warp $(Z/L^2)$ when cooled to 30° C. after heated to 285° C. is set as Y: a difference (Y−X) between the warp X and the warp Y is not less than $-18.0 \times 10^{-6}$ $(mm^{-1})$ and not more than $18.0 \times 10^{-6}$ $(mm^{-1})$, so that a difference amount of the warp can be reduced between high temperature 285° C. and low temperature 30° C. Here, the deformation amount Z of the heat sink 20 was set to be positive if the deformation is a projection toward the circuit layer side, or negative if the deformation is a projection toward the lower surface side of the heat sink 20.

In the power-module substrate with heat-sink 101, the value X of the warp $(Z/L^2)$ when heated to 285° C. is not less than $-50 \times 10^{-6}$ $(mm^{-1})$ and not more than $50 \times 10^{-6}$ $(mm^{-1})$; and the value Y of the warp $(Z/L^2)$ when cooled to 30° C. after heated to 285° C. is not less than $-50 \times 10^{-6}$ $(mm^{-1})$ and not more than $50 \times 10^{-6}$ $(mm^{-1})$.

In a case in which the warps X and Y exceed $50 \times 10^{-6}$ $(mm^{-1})$, when the power-module substrate with heat-sink 101 is connected to a water-cooled cooler or the like, an amount of grease used between the heat sink 20 and the water-cooled cooler needs to be large, so that thermal resistance may be increased. If the warps X and Y are less than $-50 \times 10^{-6}$ $(mm^{-1})$, when the power-module substrate with heat-sink 101 is connected to the water-cooled cooler or the like, load is applied to the ceramic board 11, cracks or the like may be occurred.

If the thickness t1 of the circuit layer and the thickness t2 of the metal layer are less than 0.1 mm, bonding materials used for the respective bondings of the ceramic board 11 to the circuit layer 12 and the ceramic board 11 to the metal layer 13 may flow out to the surface of the circuit layer 12. Moreover, the thickness t1 and the thickness t2 exceed 3.0 mm, the cracks may be occurred in the ceramic board 11, for example, when the power-module substrate with heat-sink 101 is heated for bonding the semiconductor elements and the like.

Moreover, if the thickness t3 of the aluminum layer 31 exceeds 3.0 mm, the warp of the power-module substrate with heat-sink 101 is large, and the thermal resistance is increased by increasing the thickness t3; as a result, cooling performance is deteriorated. It is preferable that the thickness t3 of the aluminum layer 31 be not less than 0.01 mm. If the thickness t3 is less than 0.01 mm, the bondabilities of the metal layer 13 to the aluminum layer 31, and the aluminum layer 31 to the copper layer 32 may be deteriorated.

Moreover, the thickness t4 of the copper layer 32 is less than 0.1 mm, it is not possible to show an effect of reducing the warp by providing the copper layer 32 in the power-module substrate with heat-sink 101. If the thickness t4 exceeds 5.0 mm, a large internal stress is applied on the ceramic board 11 by the copper layer 32 having high rigidity and a high coefficient of linear thermal expansion, in a case in which the power-module substrate with heat-sink 101 is heated when the semiconductor elements are bonded or the like, for example, the ceramic board 11 may be broken.

The present invention is not limited to the above-described embodiments and various modifications may be made without departing from the scope of the present invention.

EXAMPLES

Below, Examples performed for confirming the effects of the present invention will be explained. As described in Table 1, the power-module substrates with heat-sink were manufactured with varying material (the yield stress σ1) of the circuit layer, the thickness t1 and the bonding area A1 of the circuit layer, material (the yield stress σ2) of the metal layer, the thickness t2 and the bonding area A2 of the metal layer, material (the yield stress σ3) of the aluminum layer, the thickness t3 and the bonding area A3 of the aluminum layer, and material (the yield stress σ4) of the copper layer, the thickness t4 and the bonding area A4 of the copper layer.

After manufacturing the power-module substrate in which the circuit layer and the metal layer were disposed on both sides of the ceramic board, test pieces of the power-module substrates with heat-sink were manufactured by performing the solid-phase diffusion bonding to bond the metal layers of the power-module substrate and the heat sinks with interposing the aluminum layer and the copper layer.

For the copper boards to be the circuit layers, as shown in Table 1, rectangular boards having a plane size 37 mm×37 mm made of OFC (a coefficient of linear thermal expansion: $17.7 \times 10^{-6}$ K$^{-1}$, the yield stress: 200 MPa) or ZC (a coefficient of linear thermal expansion: $17.7 \times 10^{-6}$ K$^{-1}$, the yield stress: 270 MPa) were used. For the copper boards to be the metal layers, rectangular boards having a plane size 37 mm×37 mm made of OFC (the coefficient of linear thermal expansion: $17.7 \times 10^{-6}$ K$^{-1}$, the yield stress: 200 MPa) or ZC (the coefficient of linear thermal expansion: $17.7 \times 10^{-6}$ K$^{-1}$, the yield stress: 270 MPa) were used. For the ceramic boards, rectangular boards having a thickness t6=0.635 mm and a plane size 40 mm×40 mm made of AlN (a coefficient of linear thermal expansion: $4.5 \times 10^{-6}$ K$^{-1}$) were used.

For bonding the respective copper boards and the ceramic boards, Ag—Ti-based active metal brazing material was used; the copper board, the active metal brazing material, and the ceramic board were layered, and pressurized and heated with the pressurizing force the 0.1 MPa in the layer direction, at heating temperature 850° C., for 10 minutes; so that the copper board to be the circuit layer and the ceramic board, and the copper board to be the metal layer and the ceramic board were respectively bonded, and the power-module substrate was manufactured.

For the aluminum boards to be the aluminum layers, rectangular boards having a plane size 37 mm×37 mm made of 4N—Al (a coefficient of linear thermal expansion: $23.6 \times 10^{-6}$ K$^{-1}$, yield stress: 28 MPa) were used. For the copper boards to be the copper layers, rectangular boards having a plane size 37 mm×37 mm made of OFC (a coefficient of linear thermal expansion: $17.7 \times 10^{-6}$ K$^{-1}$, yield stress: 200 MPa) were used.

The bonding areas A1 to A4 in Table 1 are values calculated from the plane sizes of the metal boards to be the circuit layers, the metal layers, the aluminum layers, and the copper layers: rates S=[(σ1×t1×A1)/{(σ2×t2×A2)+(σ3×t3×A3)+(σ4×t4×A4)}] shown in Table 2 were calculated by using these values.

For the heat sinks, used were aluminum-impregnated silicon carbide porous bodies (a coefficient of linear thermal expansion: $8.5 \times 10^{-6}$ K$^{-1}$) in which Al—Si-based alloy was impregnated in silicon carbide (SiC) that were rectangular boards having the whole thickness t5=5.0 mm and a plane size 50 mm×60 mm, and formed to be the thickness t151 of the coating layers on the front and back surfaces was 100 µm. These power-module substrates, the aluminum board, the copper board, and the heat sink were layered in order, as described in Table 2, pressurized and heated with the pressurizing boards having the pressurizing surfaces of the radius of curvature R, in vacuum atmosphere, the pressurizing for the 2.1 MPa, the heating temperature 510° C., the heating time 150 minutes; so that the respective layers were bonded by the solid-phase diffusion bonding, the power-module substrate with heat-sink was manufactured. If the radius of curvature is "∞", it denotes the pressurizing surface is a flat plane.

Regarding the obtained test pieces of the power-module substrate with heat-sink, a vertical cross section was observed after ion etching with a cross section polisher (SM-09010 made by JEOL Ltd., ion acceleration voltage: 5 kV, processing time: 14 hours, projection size from shield plate: 100 µm). Then, three values were measured: i.e., the thickness of the diffusion layer formed at the bonding boundary between the metal layer and the aluminum layer, the thickness of the aluminum layer, and the thickness of the diffusion layer formed at the bonding boundary between the aluminum layer and the copper layer.

The thicknesses of the aluminum layer and the diffusion layers were measured at the bonding boundaries of the metal layer, the aluminum layer, and the copper layer in the thickness direction by line analysis by an EPMA (JXA-8530F made by JEOL Ltd., acceleration voltage: 15 kV, spot diameter: not more than 1 µm, magnification: 500, interval: 0.3 µm). In the line analysis, (1) a part in which aluminum (Al) density was not less than 90 atm % was deemed to be the aluminum layer, (2) a part in which copper (Cu) density was not less than 99 atm % was deemed to be the copper layer, (3) a part in which aluminum density was less than 90 atm % and copper (Cu) density was less than 99 atm % was deemed to be the diffusion layer: the respective thicknesses were measured. The metal layer, the copper layer, and the thickness structuring the power-module substrates with heat-sink were calculated from the obtained thickness of the aluminum layer and the thicknesses of the respective diffusion layers formed on both the sides of the aluminum layer. The thickness of the diffusion layer was a mean value of the thickness of the diffusion layer formed at the bonding boundary between the metal layer and the aluminum layer and the thickness of the diffusion layer formed at the bonding boundary between the aluminum layer and the copper layer.

Regarding the test pieces of the power-module substrate with heat-sink, "the deformation amount Z", "ceramics breakage", and "element-position displacement" were evaluated.

Measurements of the deformation amount Z were measured at (1) when heated 285° C. and (2) when cooled to 30° C. after heating 285° C. A change of flatness at the lower surface (the back surface) of the heat sink at points of time was measured by moiré interferometry in accordance with JESD22-B112 or JEITAED-7306.

The moiré interferometry is a method such as: by irradiating a measuring light to a measuring surface through a diffraction grating and taking a photo of scattered light scattered at the measuring surface through the diffraction grating with an imaging part so that moiré interference fringes are obtained, and measuring the deformation amount of the measuring surface in accordance with information of moiré interference fringes, a pitch of the diffraction grating and the like. TherMoire PS200 made by Akrometrix was used as a measuring device.

Figure 7:
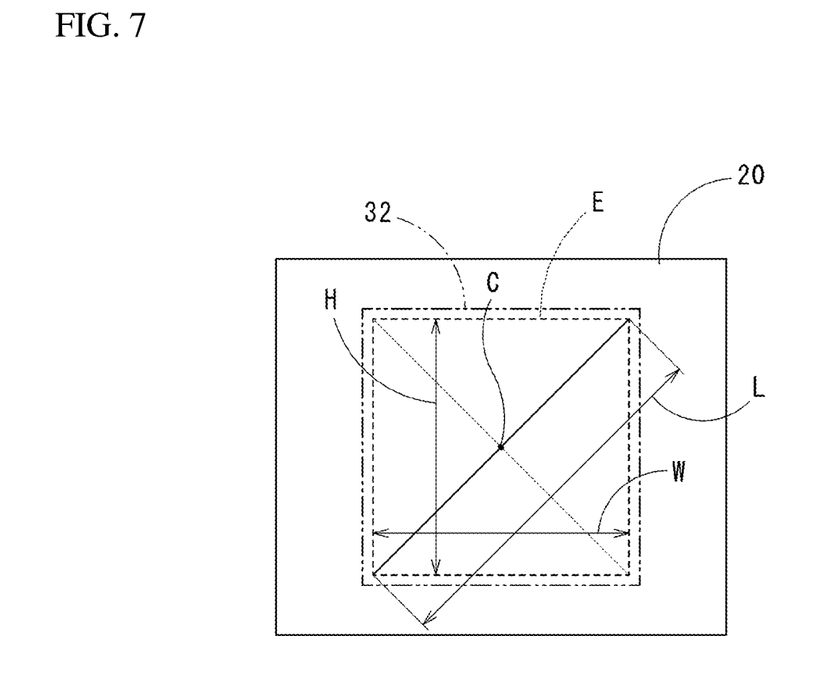
FIG. 7 It is a schematic view explaining a measuring area of a warp, and is a plan view of a lower surface of the heat sink in the power-module substrate with heat-sink.

In the present examples, as shown in FIG. 7, the deformation amount Z at the lower surface of the heat sink in the measuring area E (refer to FIG. 8A to FIG. 8C) was measured with setting the center position C of the bonding surface of the heat sink 20 and the copper layer 32 as the center of the measuring area E. The deformation amount Z was set to be positive if the deformation projected at the circuit layer side, or negative if the deformation projected at the heat sink lower surface side.

Figure 8A:
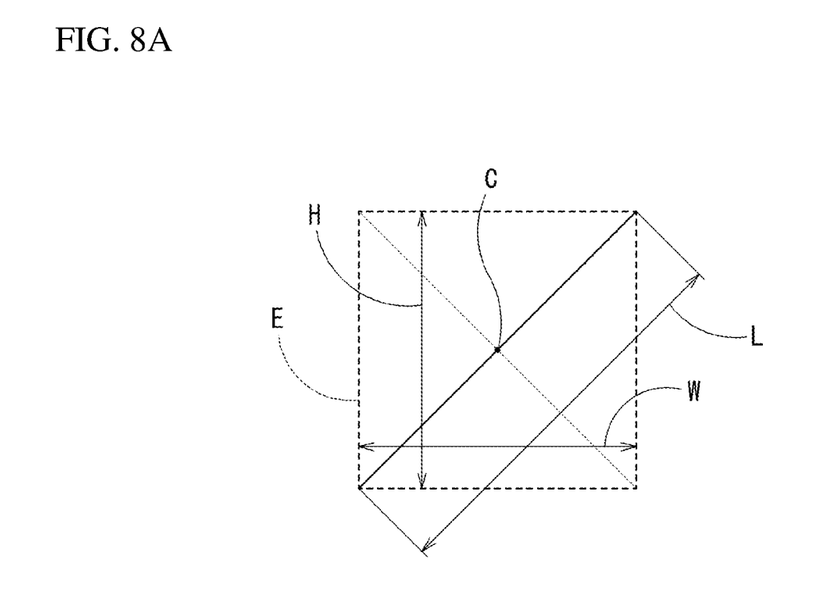
FIG. 8A It is a schematic view explaining a measuring method of the warp, and is a plan view of the measuring area.
Figure 8B:
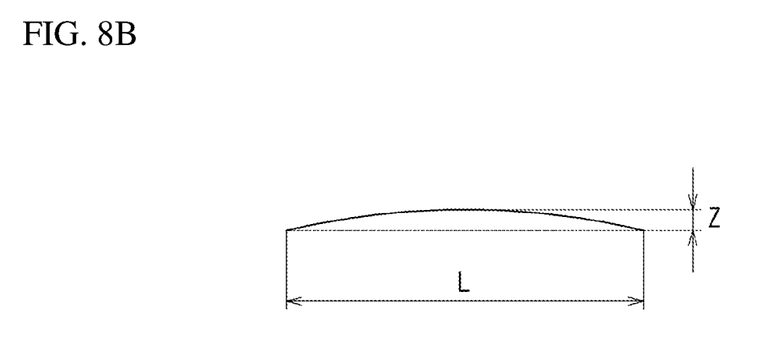
FIG. 8B It is a sectional view on a diagonal line of the measuring area when the warp is positive, in the measuring area shown in FIG. 8A.
Figure 8C:
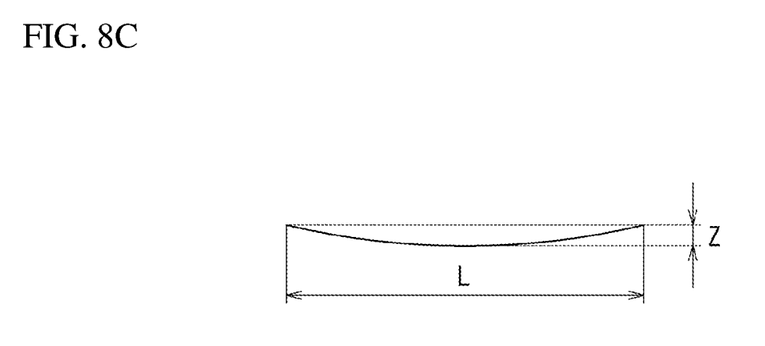
FIG. 8C It is a sectional view on the diagonal line of the measuring area when the warp is negative, in the measuring area shown in FIG. 8A.

The measuring area E is a rectangular area of W: 36 mm×H: 36 mm as shown in FIG. 7 and FIG. 8A: in this case, a length of a diagonal line of the measuring area E is the maximum length L. The deformation amount Z is, as shown in FIG. 8B or FIG. 8C, a difference between a maximum value and a minimum value of measuring values on the diagonal line of the measuring area E. The warp (Z/L$^2$) was calculated from the deformation amount Z and the maximum length L.

Ceramic breakages were evaluated by observation of the ceramic board with an ultrasonic flaw detector after the heating test described above: if a crack was generated in the ceramic board, it was rejected; or if the crack was not generated, it was passed. Regarding the element-position displacements, 30 test pieces were produced for the respective Examples and checked about existence of occurrence of position displacement, by measuring a soldering position after soldering the electronic parts on the circuit layer. If position displacement of not less than 0.2 mm was occurred, it was rejected; or if the position displacement was less than 0.2 mm, it was passed.

In the evaluation about the 30 test pieces, if a rate of being passed was not less than 90%, it was evaluated as "good": or if the rate of being passed was less than 90%, it was evaluated as "poor". Results are shown in Table 3.

TABLE 1

| Example No. | Ceramic Substrate Board Material | Thickness t6(mm) | Circuit Layer Thickness t1(mm) | Bonding Area A1 (mm$^2$) | Material | Yield Stress σ1(MPa) | Metal Layer Thickness t2(mm) | Bonding Area A2 (mm$^2$) | Material |
|---|---|---|---|---|---|---|---|---|---|
| 1 | AlN | 0.635 | 0.30 | 1369 | OFC | 200 | 0.30 | 1369 | OFC |
| 2 | AlN | 0.635 | 0.30 | 1369 | OFC | 200 | 0.80 | 1369 | OFC |
| 3 | AlN | 0.635 | 0.30 | 1369 | OFC | 200 | 0.40 | 1369 | OFC |
| 4 | AlN | 0.635 | 0.30 | 1369 | OFC | 200 | 0.24 | 1369 | OFC |
| 5 | AlN | 0.635 | 0.30 | 1369 | OFC | 200 | 0.15 | 1369 | OFC |
| 6 | AlN | 0.635 | 0.30 | 1369 | OFC | 200 | 0.30 | 1369 | OFC |
| 7 | AlN | 0.635 | 0.30 | 1369 | OFC | 200 | 0.30 | 1369 | OFC |
| 8 | AlN | 0.635 | 0.30 | 1369 | OFC | 200 | 0.30 | 1369 | OFC |
| 9 | AlN | 0.635 | 0.30 | 1369 | OFC | 200 | 0.30 | 1369 | OFC |
| 10 | AlN | 0.635 | 0.30 | 1369 | OFC | 200 | 0.30 | 1369 | OFC |
| 11 | AlN | 0.635 | 0.30 | 1369 | OFC | 200 | 0.30 | 1369 | OFC |
| 12 | AlN | 0.635 | 0.30 | 1369 | OFC | 200 | 0.30 | 1369 | OFC |
| 13 | AlN | 0.635 | 0.30 | 1369 | OFC | 200 | 0.30 | 1369 | OFC |
| 14 | AlN | 0.635 | 0.30 | 1369 | OFC | 200 | 0.30 | 1369 | OFC |
| 15 | AlN | 0.635 | 0.30 | 1258 | OFC | 200 | 0.30 | 1369 | OFC |
| 16 | AlN | 0.635 | 0.30 | 1110 | OFC | 200 | 0.30 | 1369 | OFC |
| 17 | AlN | 0.635 | 0.30 | 1369 | OFC | 200 | 0.30 | 1369 | OFC |
| 18 | AlN | 0.635 | 0.30 | 1369 | OFC | 200 | 0.30 | 1369 | OFC |
| 19 | AlN | 0.635 | 0.30 | 1369 | OFC | 200 | 0.30 | 1369 | OFC |
| 20 | AlN | 0.635 | 0.30 | 1369 | ZC | 270 | 0.30 | 1369 | ZC |
| 21 | AlN | 0.635 | 2.00 | 1369 | OFC | 200 | 2.00 | 1369 | OFC |
| 22 | AlN | 0.635 | 0.30 | 1369 | OFC | 200 | 0.30 | 1369 | OFC |
| 23 | AlN | 0.635 | 0.30 | 1369 | OFC | 200 | 0.30 | 1369 | OFC |
| 24 | AlN | 0.635 | 0.30 | 1369 | OFC | 200 | 0.30 | 1369 | OFC |
| 25 | Si$_3$N$_4$ | 0.320 | 0.30 | 1369 | OFC | 200 | 0.30 | 1369 | OFC |
| 26 | Al$_2$O$_3$ | 0.635 | 0.30 | 1369 | OFC | 200 | 0.30 | 1369 | OFC |
| 27 | AlN | 0.635 | 0.30 | 1369 | OFC | 200 | 0.30 | 1369 | OFC |
| 28 | AlN | 0.635 | 0.10 | 1369 | OFC | 200 | 0.10 | 1369 | OFC |
| 29 | AlN | 0.635 | 3.00 | 1369 | OFC | 200 | 3.00 | 1369 | OFC |
| 100 | AlN | 0.635 | 0.30 | 1369 | OFC | 200 | 0.30 | 1369 | OFC |
| 101 | AlN | 0.635 | 0.30 | 1369 | OFC | 200 | 0.30 | 1369 | OFC |
| 102 | AlN | 0.635 | 0.30 | 1369 | OFC | 200 | 0.30 | 1369 | OFC |
| 103 | AlN | 0.635 | 5.00 | 1369 | OFC | 200 | 5.00 | 1369 | OFC |
| 104 | AlN | 0.635 | 0.30 | 1369 | OFC | 200 | 0.30 | 1369 | OFC |
| 105 | AlN | 0.635 | 0.30 | 1369 | OFC | 200 | 0.25 | 1369 | OFC |
| 106 | AlN | 0.635 | 0.30 | 1369 | OFC | 200 | 0.30 | 1369 | OFC |

| Example No. | Metal Layer Yield Stress σ2(MPa) | Aluminum Layer Thickness t3(mm) | Bonding Area A3 (mm$^2$) | Material | Yield Stress σ3(MPa) | Copper Layer Thickness t4(mm) | Bonding Area A4 (mm$^2$) | Material | Yield Stress σ4(MPa) |
|---|---|---|---|---|---|---|---|---|---|
| 1 | 200 | 0.25 | 1369 | 4N—Al | 28 | 2.00 | 1369 | OFC | 200 |
| 2 | 200 | 0.25 | 1369 | 4N—Al | 28 | 2.00 | 1369 | OFC | 200 |
| 3 | 200 | 0.25 | 1369 | 4N—Al | 28 | 2.00 | 1369 | OFC | 200 |
| 4 | 200 | 0.25 | 1369 | 4N—Al | 28 | 2.00 | 1369 | OFC | 200 |
| 5 | 200 | 0.25 | 1369 | 4N—Al | 28 | 2.00 | 1369 | OFC | 200 |
| 6 | 200 | 0.25 | 1369 | 4N—Al | 28 | 0.10 | 1369 | OFC | 200 |
| 7 | 200 | 0.25 | 1369 | 4N—Al | 28 | 0.20 | 1369 | OFC | 200 |
| 8 | 200 | 0.25 | 1369 | 4N—Al | 28 | 0.60 | 1369 | OFC | 200 |
| 9 | 200 | 0.25 | 1369 | 4N—Al | 28 | 1.00 | 1369 | OFC | 200 |
| 10 | 200 | 0.25 | 1369 | 4N—Al | 28 | 3.00 | 1369 | OFC | 200 |
| 11 | 200 | 0.25 | 1369 | 4N—Al | 28 | 5.00 | 1369 | OFC | 200 |
| 12 | 200 | 0.25 | 1369 | 4N—Al | 28 | 2.00 | 1369 | OFC | 200 |
| 13 | 200 | 0.25 | 1369 | 4N—Al | 28 | 2.00 | 1369 | OFC | 200 |
| 14 | 200 | 0.05 | 1369 | 4N—Al | 28 | 2.00 | 1369 | OFC | 200 |
| 15 | 200 | 0.25 | 1369 | 4N—Al | 28 | 2.00 | 1369 | OFC | 200 |
| 16 | 200 | 0.25 | 1369 | 4N—Al | 28 | 2.00 | 1369 | OFC | 200 |
| 17 | 200 | 1.00 | 1369 | 4N—Al | 28 | 2.00 | 1369 | OFC | 200 |

TABLE 1-continued

| | | | | | | | | | |
|---|---|---|---|---|---|---|---|---|---|
| 18 | 200 | 2.00 | 1369 | 4N—Al | 28 | 2.00 | 1369 | OFC | 200 |
| 19 | 200 | 3.00 | 1369 | 4N—Al | 28 | 2.00 | 1369 | OFC | 200 |
| 20 | 270 | 0.25 | 1369 | 4N—Al | 28 | 2.00 | 1369 | OFC | 200 |
| 21 | 200 | 0.25 | 1369 | 4N—Al | 28 | 2.00 | 1369 | OFC | 200 |
| 22 | 200 | 0.25 | 1369 | A1050 | 30 | 2.00 | 1369 | OFC | 200 |
| 23 | 200 | 0.25 | 1369 | A3003 | 40 | 2.00 | 1369 | OFC | 200 |
| 24 | 200 | 0.25 | 1369 | A6063 | 50 | 2.00 | 1369 | OFC | 200 |
| 25 | 200 | 0.25 | 1369 | 4N—Al | 28 | 2.00 | 1369 | OFC | 200 |
| 26 | 200 | 0.25 | 1369 | 4N—Al | 28 | 2.00 | 1369 | OFC | 200 |
| 27 | 200 | 0.25 | 1369 | 4N—Al | 28 | 2.00 | 1369 | ZC | 270 |
| 28 | 200 | 0.25 | 1369 | 4N—Al | 28 | 1.50 | 1369 | OFC | 200 |
| 29 | 200 | 0.25 | 1369 | 4N—Al | 28 | 2.00 | 1369 | OFC | 200 |
| 100 | 200 | 0.25 | 1369 | 4N—Al | 28 | 0.05 | 1369 | OFC | 200 |
| 101 | 200 | 0.25 | 1369 | 4N—Al | 28 | 7.00 | 1369 | OFC | 200 |
| 102 | 200 | 6.00 | 1369 | A6063 | 50 | 2.00 | 1369 | OFC | 200 |
| 103 | 200 | 0.25 | 1369 | 4N—Al | 28 | 2.00 | 1369 | OFC | 200 |
| 104 | 200 | 3.00 | 1369 | 4N—Al | 28 | 5.00 | 1369 | OFC | 200 |
| 105 | 200 | 0.10 | 1369 | 4N—Al | 28 | 0.10 | 1369 | OFC | 200 |
| 106 | 200 | — | — | — | — | — | — | — | — |

TABLE 2

| Example No. | Radius of Curvature R (mm) | Rate S |
|---|---|---|
| 1 | 7000 | 0.13 |
| 2 | 7000 | 0.11 |
| 3 | 7000 | 0.12 |
| 4 | 7000 | 0.13 |
| 5 | 7000 | 0.14 |
| 6 | 7000 | 0.69 |
| 7 | 7000 | 0.56 |
| 8 | 7000 | 0.32 |
| 9 | 7000 | 0.22 |
| 10 | 7000 | 0.09 |
| 11 | 7000 | 0.06 |
| 12 | 3000 | 0.13 |
| 13 | ∞ | 0.13 |
| 14 | 3000 | 0.13 |
| 15 | 7000 | 0.12 |
| 16 | 7000 | 0.10 |
| 17 | 3000 | 0.12 |
| 18 | 3000 | 0.12 |
| 19 | 3000 | 0.11 |
| 20 | 7000 | 0.17 |
| 21 | 7000 | 0.50 |
| 22 | 7000 | 0.13 |
| 23 | 7000 | 0.13 |
| 24 | 7000 | 013 |
| 25 | 7000 | 0.13 |
| 26 | 7000 | 0.13 |
| 27 | 7000 | 0.10 |
| 28 | 7000 | 0.06 |
| 29 | 7000 | 0.60 |
| 100 | 7000 | 0.78 |
| 101 | 7000 | 0.04 |
| 102 | 3000 | 0.08 |
| 103 | 7000 | 0.71 |
| 104 | 7000 | 0.05 |
| 105 | 7000 | 0.82 |
| 106 | 7000 | — |

TABLE 3

| Example No. | Warp (Z/L$^2$) [×10$^{-6}$ (mm$^{-1}$)] | | | Ceramic Breakage | Element-Position Displacement |
|---|---|---|---|---|---|
| | 285° C. Heated (X) | 30° C. Cooled (Y) | Difference (Y − X) | | |
| 1 | −11.9 | −5.9 | 6.0 | GOOD | GOOD |
| 2 | −11.0 | −6.8 | 4.2 | GOOD | GOOD |
| 3 | −15.1 | −10.0 | 5.1 | GOOD | GOOD |
| 4 | −9.1 | −1.8 | 7.3 | GOOD | GOOD |
| 5 | −13.5 | −5.0 | 8.5 | GOOD | GOOD |
| 6 | −16.4 | 1.0 | 17.4 | GOOD | GOOD |
| 7 | −10.3 | 2.3 | 12.6 | GOOD | GOOD |
| 8 | −17.8 | −14.2 | 3.6 | GOOD | GOOD |
| 9 | −16.5 | −12.9 | 3.6 | GOOD | GOOD |
| 10 | −0.3 | 0.4 | 0.7 | GOOD | GOOD |
| 11 | −2.1 | −14.6 | −12.5 | GOOD | GOOD |
| 12 | −35.4 | −29.8 | 5.6 | GOOD | GOOD |
| 13 | 6.6 | 12.0 | 5.4 | GOOD | GOOD |
| 14 | −12.1 | 12.0 | 3.3 | GOOD | GOOD |
| 15 | −10.3 | −5.1 | 5.2 | GOOD | GOOD |
| 16 | −9.8 | −5.1 | 4.7 | GOOD | GOOD |
| 17 | −13.5 | −6.4 | 7.1 | GOOD | GOOD |
| 18 | −9.5 | −1.7 | 7.8 | GOOD | GOOD |
| 19 | −14.3 | −2.0 | 12.3 | GOOD | GOOD |
| 20 | −10.7 | −6.8 | 3.9 | GOOD | GOOD |
| 21 | −15.4 | −7.0 | 8.4 | GOOD | GOOD |
| 22 | −4.1 | 2.4 | 6.5 | GOOD | GOOD |
| 23 | −16.8 | −10.9 | 5.9 | GOOD | GOOD |
| 24 | −6.8 | −4.7 | 2.1 | GOOD | GOOD |
| 25 | −25.5 | −13.4 | 12.1 | GOOD | GOOD |
| 26 | −31.6 | −23.7 | 7.9 | GOOD | GOOD |
| 27 | −16.4 | −12.3 | 4.1 | GOOD | GOOD |
| 28 | −7.2 | −9.6 | −2.4 | GOOD | GOOD |
| 29 | −4.6 | −11.0 | −6.4 | GOOD | GOOD |
| 100 | −23.0 | −4.5 | 18.5 | GOOD | POOR |
| 101 | 6.3 | −12.5 | −18.8 | POOR | POOR |
| 102 | −7.4 | −23.0 | −15.6 | POOR | GOOD |
| 103 | −16.4 | −21.2 | −4.8 | POOR | GOOD |
| 104 | −7.7 | −26.3 | −18.6 | GOOD | POOR |
| 105 | −24.1 | −5.0 | 19.1 | GOOD | POOR |
| 106 | 46.8 | 65.8 | 19.0 | GOOD | POOR |

As recognized from Tables 1 to 3, regarding the test pieces of Examples Nos. 1 to 29 in which the thickness t1 and the thickness t2 were not less than 0.1 mm and not more than 3.0 mm, the thickness t3 of the aluminum layer t3 was not more than 3.0 mm, the thickness t4 of the copper layer t4 was not less than 0.1 mm and not more than 5.0 mm, and the ratio [(σ1×t1×A1)/{(σ2×t2×A2)+(σ3×t3×A3)+(σ4×t4×A4)}] was in a range not less than 0.06 and not more than 0.7, the differences (Y−X) were not less than −18.0×10$^{-6}$ (mm$^{-1}$) and not more than 18.0×10$^{-6}$ (mm$^{-1}$). In these test pieces of Examples Nos. 1 to 29, both the evaluation of the "ceramic breakage" and the "element-position displacement" showed good results.

On the other hand, regarding the test pieces of Examples Nos. 100 to 105 in which the conditions that the thickness t1, the thickness t2, the ratio $[(\sigma 1 \times t1 \times A1)/\{(\sigma 2 \times t2 \times A2)+(\sigma 3 \times t3 \times A3)+(\sigma 4 \times t4 \times A4)\}]$, the thickness t3, the thickness t4 were out of the above described range and the test piece of Example No. 106 in which the copper layer and the aluminum layer were not provided, the difference (Y−X) was out of the range not less than $-18.0 \times 10^{-6}$ (mm$^{-1}$) and not more than $18.0 \times 10^{-6}$ (mm$^{-1}$), so that the difference amount of the warp was large, and the test pieces in which the "element-position displacement" was occurred and the test pieces in which the "ceramic breakage" was occurred were found.

INDUSTRIAL APPLICABILITY

It is possible to reduce the breakages of the ceramic board resulting from the temperature variation, and the reliability to the power cycles and the hot-cold cycles can be improved.

REFERENCE SIGNS LIST

10 Power-module substrate
11 Ceramic board
12 Circuit layer
13 Metal layer
20 Heat sink
21 Porous body
22 Coating layer
31 Aluminum layer
32 Copper layer
33, 34, 35 Diffusion layer
50 Pressurizing tool
51, 52 Pressurizing board
101 Power-module substrate with heat-sink
201 Power module

The invention claimed is:

1. A power-module substrate with heat-sink comprising:
a power-module substrate wherein a circuit layer made of copper or a copper alloy is disposed on one surface of a ceramic board and a metal layer made of copper or a copper alloy disposed on another surface of the ceramic board;
an aluminum layer made of aluminum or an aluminum alloy and bonded on the metal layer;
a copper layer made of copper or a copper alloy and bonded on the aluminum layer; and
a heat sink bonded on the copper layer and formed from an aluminum-impregnated silicon carbide porous body in which aluminum or an aluminum alloy is impregnated to a porous body made of silicon carbide, wherein:
between the metal layer and the aluminum layer, between the aluminum layer and the copper layer, and between the copper layer and the aluminum-impregnated silicon carbide porous body, the layers are directly bonded to each other, and diffusion layers having intermetallic compounds of aluminum and copper are formed;
when yield stress of the circuit layer is $\sigma 1$ (MPa), a thickness of the circuit layer is t1 (mm), a bonding area of the circuit layer to the ceramic board is A1 (mm$^2$); yield stress of the metal layer is $\sigma 2$ (MPa), a thickness of the metal layer is t2 (mm), a bonding area of the metal layer to the ceramic board is A2 (mm$^2$); yield stress of the aluminum layer is $\sigma 3$ (MPa), a thickness of the aluminum layer is t3 (mm), a bonding area of the aluminum layer to the metal layer is A3 (mm$^2$); yield stress of the copper layer is $\sigma 4$ (MPa), a thickness of the copper layer is t4 (mm), and a bonding area of the copper layer to the aluminum layer is A4 (mm$^2$), wherein
the thickness t1 is formed to be not less than 0.1 mm and not more than 3.0 mm;
the thickness t2 is formed to be not less than 0.1 mm and not more than 3.0 mm;
the thickness t3 is formed to be not more than 3.0 mm; and
the thickness t4 is formed to be not less than 0.1 mm and not more than 5.0 mm, and wherein
a ratio $[(\sigma 1 \times t1 \times A1)/\{(\sigma 2 \times t2 \times A2)+(\sigma 3 \times t3 \times A3)+(\sigma 4 \times t4 \times A4)\}]$ is in a range not less than 0.06 and not more than 0.70.

2. The power-module substrate with heat-sink according to claim 1, wherein
on a lower surface of the heat sink,
when a center position of a bonding surface of the heat sink to the copper layer is a center of a measuring area, a maximum length in the measuring area is L (mm), and a deformation amount of the heat sink in the measuring area is Z (mm), and
when a value of a warp $(Z/L^2)$ is X when it is heated to 285° C., and a value of a warp $(Z/L^2)$ is Y when it is cooled to 30° C. after heated to 285° C.,
a difference (Y−X) between the warp X and the warp Y is not less than $-18.0 \times 10^{-6}$ (mm$^{-1}$) and not more than $18.0 \times 10^{-6}$ (mm$^{-1}$).

3. The power-module substrate with heat-sink according to claim 1, wherein a ratio (t1/t2) of the thickness t1 of the circuit layer to the thickness t2 of the metal layer is not less than 0.75 and less than 1.25.

4. The power-module substrate with heat-sink according to claim 2, wherein the warp X is not less than $-50 \times 10^{-6}$ (mm$^{-1}$) and not more than $50 \times 10^{-6}$ (mm$^{-1}$), and the warp Y is not less than $-50 \times 10^{-6}$ (mm$^{-1}$) and not more than $50 \times 10^{-6}$ (mm$^{-1}$).

5. The power-module substrate with heat-sink according to claim 1, wherein the thickness t3 of the aluminum layer is not less than 0.01 mm.

6. The power-module substrate with heat-sink according to claim 1, wherein the heat sink is formed by impregnating aluminum or aluminum alloy inside a porous body made of silicon carbide, a surface of the heat sink is formed by a coating layer of impregnated aluminum or aluminum alloy, the thickness of the heat sink is not less than 0.5 mm and not more than 5.0 mm, and the thickness of the coating layer in one surface is 0.01-folds to 0.1-folds of the thickness of the heat sink.

* * * * *